(12) United States Patent
Chio

(10) Patent No.: US 11,021,791 B2
(45) Date of Patent: Jun. 1, 2021

(54) FILM FORMING APPARATUS, FILM FORMING METHOD, AND METHOD FOR MANUFACTURING A SEMICONDUCTOR DEVICE USING THE FILM FORMING APPARATUS

(71) Applicant: Samsung Electronics Co., Ltd., Suwon-si (KR)

(72) Inventor: Hyun Ho Chio, Yongin-si (KR)

(73) Assignee: Samsung Electronics Co., Ltd.

( * ) Notice: Subject to any disclaimer, the term of this patent is extended or adjusted under 35 U.S.C. 154(b) by 167 days.

(21) Appl. No.: 16/167,938

(22) Filed: Oct. 23, 2018

(65) Prior Publication Data

US 2019/0345604 A1 Nov. 14, 2019

(30) Foreign Application Priority Data

May 8, 2018 (KR) .................. 10-2018-0052462

(51) Int. Cl.
*C23C 16/44* (2006.01)
*H01L 21/673* (2006.01)
*C23C 16/455* (2006.01)
*C23C 16/52* (2006.01)

(52) U.S. Cl.
CPC .... *C23C 16/4412* (2013.01); *C23C 16/45578* (2013.01); *C23C 16/52* (2013.01); *H01L 21/67393* (2013.01)

(58) Field of Classification Search
CPC ................................................ C23C 16/52
See application file for complete search history.

(56) References Cited

U.S. PATENT DOCUMENTS

| 5,217,560 A | 6/1993 | Kurono et al. |
| 6,391,116 B2 | 5/2002 | Moriyama |
| 2002/0168866 A1* | 11/2002 | Moriya ............... C23C 16/4583 438/745 |

(Continued)

FOREIGN PATENT DOCUMENTS

| JP | 3165928 | 5/2001 |
| JP | 2012023073 | 2/2012 |

(Continued)

OTHER PUBLICATIONS

Lee 10-2006-0066797 Jun. 2006 English Machine translation (Year: 2006).*

(Continued)

*Primary Examiner* — Joseph A Miller, Jr.
(74) *Attorney, Agent, or Firm* — Myers Bigel, P.A.

(57) ABSTRACT

A film forming apparatus is provided. The film forming apparatus includes an inner tube configured to accommodate a workpiece and having a first space defined by a side wall of the inner tube and an upper wall of the inner tube that is connected to the side wall, an exhaust pipe fluidly connected to the first space, at least one top hole defined in the upper wall of the inner tube, at least one side hole defined in the side wall of the inner tube, an outer tube surrounding the inner tube, and a reaction gas supply pipe fluidly connected to a second space defined by and formed between the inner tube and the outer tube, wherein the reaction gas supply pipe is positioned higher vertically than the exhaust pipe.

19 Claims, 11 Drawing Sheets

(56) References Cited

U.S. PATENT DOCUMENTS

| | | |
|---|---|---|
| 2009/0159004 A1* | 6/2009 | Yoshioka ............ C23C 16/4401 |
| | | 118/715 |
| 2012/0247391 A1 | 10/2012 | Endo et al. |
| 2015/0191818 A1* | 7/2015 | Yang ................... C23C 16/4412 |
| | | 118/715 |
| 2015/0240120 A1* | 8/2015 | Fujikawa ................ C23C 16/52 |
| | | 427/255.28 |
| 2017/0301539 A1 | 10/2017 | Sano et al. |
| 2017/0335452 A1 | 11/2017 | Yamazaki et al. |
| 2017/0365459 A1 | 12/2017 | Ohashi |
| 2017/0365467 A1 | 12/2017 | Shimamoto et al. |
| 2017/0372890 A1 | 12/2017 | Horiike et al. |

FOREIGN PATENT DOCUMENTS

| | | |
|---|---|---|
| KR | 20060035824 | 4/2006 |
| KR | 20060066797 | 6/2006 |
| KR | 20100077813 | 7/2010 |

OTHER PUBLICATIONS

Lee 10-2010-0077813 Jul. 8, 2010 English machine translation (Year: 2010).*

* cited by examiner

FILM FORMING APPARATUS, FILM FORMING METHOD, AND METHOD FOR MANUFACTURING A SEMICONDUCTOR DEVICE USING THE FILM FORMING APPARATUS

This application claims priority from Korean Patent Application No. 10-2018-0052462, filed on May 8, 2018 in the Korean Intellectual Property Office, the disclosure of which is incorporated herein by reference in its entirety.

BACKGROUND

The present disclosure relates to a film forming apparatus, a film forming method using the film forming apparatus, and a method of fabricating a semiconductor device using the film forming apparatus.

A film forming apparatus can form a film by introducing a reaction gas onto a semiconductor wafer placed in the film forming apparatus. In order to form a film on a semiconductor wafer, a reaction gas may be introduced into a film forming apparatus.

For a film forming apparatus having a vertical structure, the concentrations of the introduced reaction gas may be different for different positions of the film forming apparatus. For example, the concentrations of the reaction gas may be high at the top of the film forming apparatus, while it may be very low at the bottom of the film forming apparatus. When this happens, the thicknesses of wafers may not be uniform depending on the positions of the film forming apparatus where they are placed.

Incidentally, when a long nozzle is employed to introduce a reaction gas into the film forming apparatus, there may arise a problem that the reaction gas fails to smoothly flow into the film forming apparatus if the long nozzle is clogged.

SUMMARY

Aspects of the present disclosure provide a film forming apparatus, a film forming method, and a method of fabricating a semiconductor device using the film forming apparatus that allow a reaction gas to be smoothly supplied into the film forming apparatus.

Aspects of the present disclosure provide a film forming apparatus, a film forming method, and a method of fabricating a semiconductor device using the film forming apparatus that can achieve a relatively uniform concentration of a reaction gas at different areas of the film forming apparatus.

According to some embodiments of the present inventive concept, there is provided a film forming apparatus including an inner tube configured to accommodate a workpiece and having a first space defined by a side wall of the inner tube and an upper wall of the inner tube that is connected to the side wall, an exhaust pipe fluidly connected to the first space, at least one top hole defined in the upper wall of the inner tube, at least one side hole defined in the side wall of the inner tube, an outer tube surrounding the inner tube, and a reaction gas supply pipe fluidly connected to a second space defined by and formed between the inner tube and the outer tube, wherein the reaction gas supply pipe is positioned higher vertically than the exhaust pipe.

According to some embodiments of the present inventive concept, there is provided a method of fabricating a semiconductor device, the method including preparing a semiconductor wafer and forming a first film on the semiconductor wafer by using a film forming apparatus, wherein the film forming apparatus includes an inner tube configured to accommodate the semiconductor wafer and having a first space defined by a side wall of the inner tube and an upper wall of the inner tube connected to the side wall, an exhaust pipe fluidly connected to the first space, at least one top hole defined in the upper wall of the inner tube, at least one side hole defined in the side wall of the inner tube, an outer tube surrounding the inner tube, and a reaction gas supply pipe fluidly connected to a second space defined by and formed between the inner tube and the outer tube, wherein the reaction gas supply pipe is positioned higher vertically than the exhaust pipe.

According to some embodiments of the present inventive concept, there is provided a film forming method including loading a workpiece into a first space defined by a side wall of an inner tube and an upper wall of the inner tube extending inwardly from the side wall of the inner tube, supplying a reaction gas used to form a first film through a reaction gas supply pipe fluidly connected to a second space defining between the inner tube and an outer tube surrounding the inner tube, wherein the reaction gas is introduced into the first space where the workpiece is accommodated through at least one top hole defined in the upper wall of the inner tube and at least one side hole defined in the side wall of the inner tube, forming a first film on the workpiece using the reaction gas, and discharging the reaction gas in the first space through an exhaust pipe fluidly connected to the first space, wherein the reaction gas supply pipe is positioned higher vertically than the exhaust pipe.

These and other aspects, embodiments and advantages of the present disclosure will become apparent to those of ordinary skill in the art upon review of the Detailed Description and Claims to follow.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

As used herein the expression "and/or" includes any and all combinations of one or more of the associated listed items.

Hereinafter, a film forming apparatus according to some example embodiments of the present disclosure will be described with reference to FIGS. 1 to 3.

Figure 1:
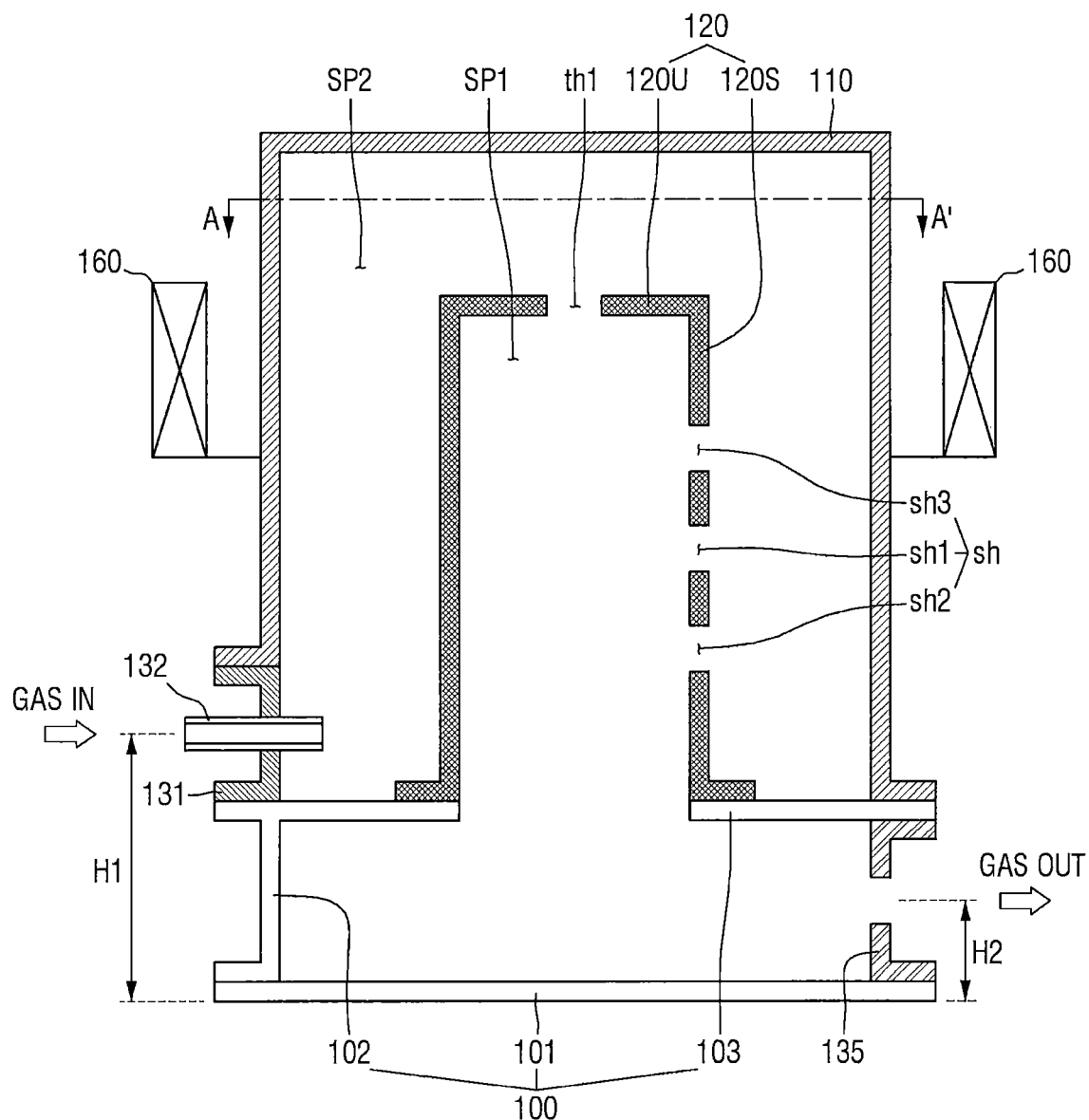
FIG. 1 is a cross-sectional view for illustrating a film forming apparatus according to some example embodiments of the present disclosure.

FIG. 1 is a cross-sectional view for illustrating a film forming apparatus according to some example embodiments of the present disclosure. FIG. 2 is a cross-sectional view taken along line A-A' of FIG. 1. FIG. 3 is a perspective view for illustrating the inner tube 120 and side wall holes sh in FIG. 1.

Figure 2:
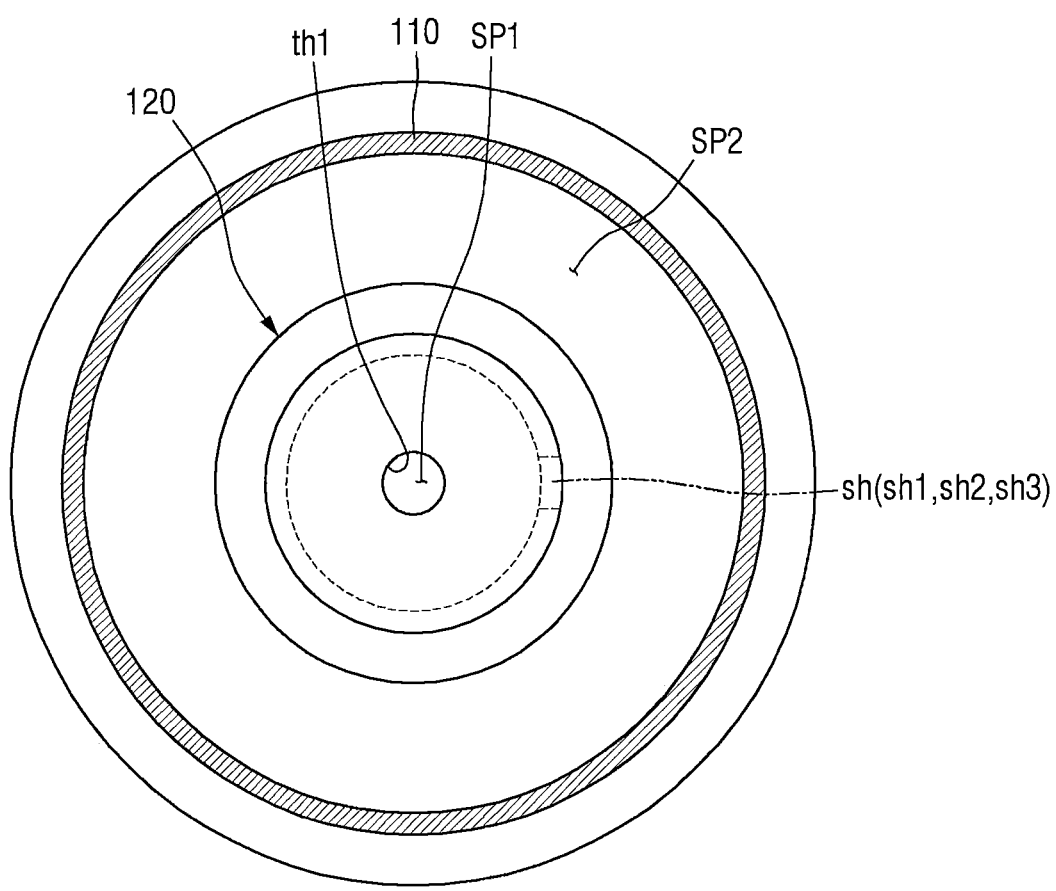
FIG. 2 is a cross-sectional view taken along line A-A' of FIG. 1.

FIG. 2 shows only the outer tube 110 and the inner tube 120 for the sake of clarity. FIG. 3 shows only the inner tube 120 for the sake of clarity.

Referring to FIG. 1, a film forming apparatus according to some example embodiments of the present disclosure may include an outer tube 110, an inner tube 120, a reaction gas supply pipe 131, a nozzle 132, a tube support 100, a heater 160, and an exhaust pipe 135.

The tube support 100 may include a first support 101, a second support 102, and a third support 103. The second support 102 and the third support 103 may be disposed on the first support 101. The tube support 100 may support the outer tube 110 and the inner tube 120.

Although the tube support 100 is shown as having a particular shape, the technical idea of the present disclosure is not limited thereto. For example, the number of supports and the shape of the tube support 100 may vary. For example, it is to be understood that the number of supports and shape of the tube support 100 are not particularly limited as long as it can support the inner tube 120 and the outer tube 110.

The first support 101 may further include a seal member passing through the first support 101. In addition, a rotary shaft may be further disposed in the seal member. This will be described in more detail with reference to FIGS. 8 and 9.

The inner tube 120 may be disposed on and supported by the tube support 100. The inner tube 120 may include a side wall 120S and an upper surface or upper wall 120U connected to or extending inwardly from the side wall 120S. The side wall 120S and the upper surface 120U of the inner tube 120 may define or form a first space SP1.

The first space SP1 may be the internal space of the inner tube 120, for example. The first space SP1 may be, for example, a space in which a workpiece is accommodated inside the inner tube 120. The first space SP1 may be connected (or fluidly connected) to the outside of the film forming apparatus via, for example, the exhaust pipe 135.

The inner tube 120 may include a first top hole or first upper hole th1 and a side wall hole or side hole sh.

Figure 3:
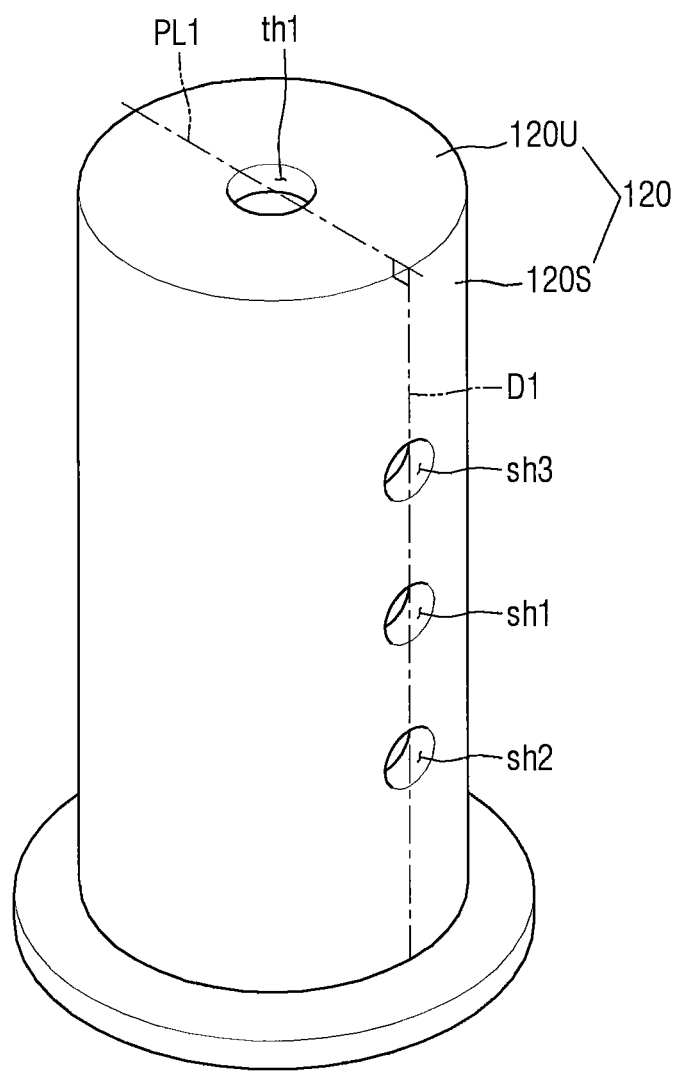
FIG. 3 is a perspective view for illustrating the inner tube and side wall holes in FIG. 1.

Referring to FIGS. 1, 2 and 3, the first top hole th1 may be defined or formed in the upper surface 120U of the inner tube 120. The first top hole th1 may penetrate a part of the upper surface 120U of the inner tube 120. In other words, the first top hole th1 may not entirely open the upper surface 120U of the inner tube 120. The side wall of the first top hole th1 may be defined by the upper surface 120U of the inner tube 120. The first top hole th1 may connect (or fluidly connect) the first space SP1 with the second space SP2.

In some example embodiments, the first top hole th1 may be formed in the center of the upper surface 120U of the inner tube 120.

The side wall hole sh may be defined or formed in the side wall 120S of the inner tube 120. The side wall hole sh may penetrate a part of the side wall 120S of the inner tube 120. In other words, the side wall hole sh may not entirely open the side wall 120S of the inner tube 120. The side wall hole sh may connect (or fluidly connect) the first space SP1 with the second space SP2.

The side wall hole sh may be formed, for example, on a first side of the side wall 120S of the inner tube 120. The first side of the side wall 120S of the inner tube 120 may refer to the side adjacent and/or facing the exhaust pipe 135 via which the reaction gas is discharged (GAS OUT). The second side of the side wall 120S of the inner tube 120 may refer to the side adjacent and/or facing the reaction gas supply pipe 131 via which the reaction gas is supplied (GAS IN). The first side of the side wall 120S of the inner tube 120 may be closer to the exhaust pipe 135 than is the second side. For example, the first and second sides of the side wall 120S of the inner tube 120 may be opposing sides. The first and second sides of the side wall 120S of the inner tube 120 may be diametrically opposed.

The side wall hole sh may include a first side wall hole or first side hole sh1, a second side wall hole or second side hole sh2 and a third side wall hole or third side hole sh3. The first side wall hole sh1 may be located or positioned higher vertically than the second side wall hole sh2. The third side wall hole sh3 may be located or positioned higher vertically than the first side wall hole sh1.

In some example embodiments, the first side wall hole sh1, the second side wall hole sh2 and the third side wall hole sh3 may be aligned with one another in a first direction D1 perpendicular to the upper surface 120U of the inner tube 120. For example, the first direction D1 may be perpendicular to a first parallel line PL1, which is parallel to the upper surface 120U of the inner tube 120. The first direction D1 may be vertical.

Although the outer tube 110 and the inner tube 120 are shown as being cylindrical in FIGS. 2 and 3, the technical idea of the present disclosure is not limited thereto. For example, it is to be understood that each of the outer tube 110 and the inner tube 120 may have any shape suitable for the film forming apparatus.

Although the first top hole th1 and the side wall holes sh are shown as being circular in FIGS. 2 and 3, the technical idea of the present disclosure is not limited thereto. For example, each of the first top hole th1 and the side wall holes sh may have any shape as long as they can connect (or fluidly connect) the first space SP1 with the second space SP2.

Referring back to FIG. 1, the exhaust pipe 135 may be disposed, for example, between the first support 101 and the third support 103. However, the technical idea of the present disclosure is not limited thereto. For example, the exhaust pipe 135 may be disposed at such a position that it can connect (or fluidly connect) the first space SP1 with the outside of the film forming apparatus.

In addition, although the exhaust pipe 135 is shown as having a particular shape in the drawings, the technical idea of the present disclosure is not limited thereto. For example, it is to be understood that the exhaust pipe 135 may have any shape as long as it can connect (or fluidly connect) the first space SP1 with the outside of the film forming apparatus.

When the reaction gas is supplied into the film forming apparatus (GAS IN), the exhaust pipe 135 may discharge the reaction gas supplied into the first space SP1 to the outside of the film forming apparatus (GAS OUT).

The outer tube 110 may be disposed on and supported by the tube support 100. The outer tube 110 may enclose and/or surround the inner tube 120. In other words, the inner tube 120 may be disposed inside the outer tube 110.

As the inner tube 120 is disposed inside the outer tube 110, the inner tube 120 and the outer tube 110 may define or form a second space SP2. The second space SP2 may be the space between the inner tube 120 and the outer tube 110.

The second space SP2 may not be directly connected (or directly fluidly connected) to the exhaust pipe 135. For example, the second space SP2 may be connected (or fluidly connected) to the outside of the film forming apparatus through the first space SP1 and the exhaust pipe 135. The second space SP2 may be connected (or fluidly connected) to the first space SP1, for example, through the first top hole th1 and the side wall holes sh.

The reaction gas may be supplied into the second space SP2 (GAS IN) through the reaction gas supply pipe 131, for example.

The reaction gas supply pipe 131 may be disposed, for example, between the outer tube 110 and the second support 102. However, the technical idea of the present disclosure is not limited thereto. The reaction gas supply pipe 131 may be disposed, for example, at such a position that it can introduce the reaction gas into the second space SP2 (GAS IN).

In addition, although the reaction gas supply pipe 131 is shown as having a particular shape in the drawings, the technical idea of the present disclosure is not limited thereto. For example, the reaction gas supply pipe 131 may have any shape as long as it can introduce the reaction gas (GAS IN) into the second space SP2.

The reaction gas supply pipe 131 may be connected to the second space SP2. When the reaction gas is supplied into the film forming apparatus (GAS IN), the reaction gas supply pipe 131 may introduce the reaction gas into the second space SP2 (GAS IN).

The reaction gas supply pipe 131 may be positioned higher vertically than the exhaust pipe 135. For example, the reaction gas supply pipe 131 may be located or positioned at a first height H1 (e.g., a center of the reaction gas supply pipe 131 may be positioned at the first height H1). In addition, the exhaust pipe 135 may be located or positioned at a second height H2 (e.g., a center of the exhaust pipe may be positioned at the second height H2). The first height H1 may be greater than the second height H2.

The first height H1 may refer to a distance from the bottom of the film forming apparatus to a certain position of the reaction gas supply pipe 131. The certain position of the reaction gas supply pipe 131 may refer to a position where a nozzle 132 for introducing the reaction gas (GAS IN) into the second space SP2 is to be inserted, for example.

The second height H2 may refer to a distance from the bottom of the film forming apparatus to a certain position of the exhaust pipe 135. For example, the certain position of the exhaust pipe 135 may refer to a position where a hole for the exhaust pipe 135 is formed through which the reaction gas in the first space SP1 is discharged to the outside of the film forming apparatus.

Since the reaction gas supply pipe 131 is positioned higher than the exhaust pipe 135, the reaction gas can be smoothly introduced from the second space SP2 to the first space SP1 (GAS IN) during a subsequent process of supplying the reaction gas into the film forming apparatus (GAS IN). As the reaction gas is introduced from the second space SP2 into the first space SP1 (GAS IN), the reaction gas can have a relatively uniform concentration at different positions of the inner tube 120.

The nozzle 132 may be inserted into the reaction gas supply pipe 131. The nozzle 132 may be disposed to face the second space SP2. The nozzle 132 may not extend vertically along or adjacent the side wall 120S of the inner tube 120, for example.

When the reaction gas is supplied into the film forming apparatus (GAS IN), the reaction gas may be introduced (e.g., horizontally) into the second space SP2 along and/or through the nozzle 132 inserted into the reaction gas supply pipe 131 (GAS IN).

The heater 160 may be disposed near the side wall of the outer tube 110. The heater 160 may heat the first space SP1 of the inner tube 120. The heater 160 may activate the introduced reaction gas when the reaction gas is supplied into the film forming apparatus (GAS IN). When a workpiece is placed in the first space SP1, the heater 160 may heat up the workpiece.

Hereinafter, a film forming apparatus according to some example embodiments of the present disclosure will be described with reference to FIG. 4. For the sake of brevity and clarity, any redundant description may be omitted.

Figure 4:
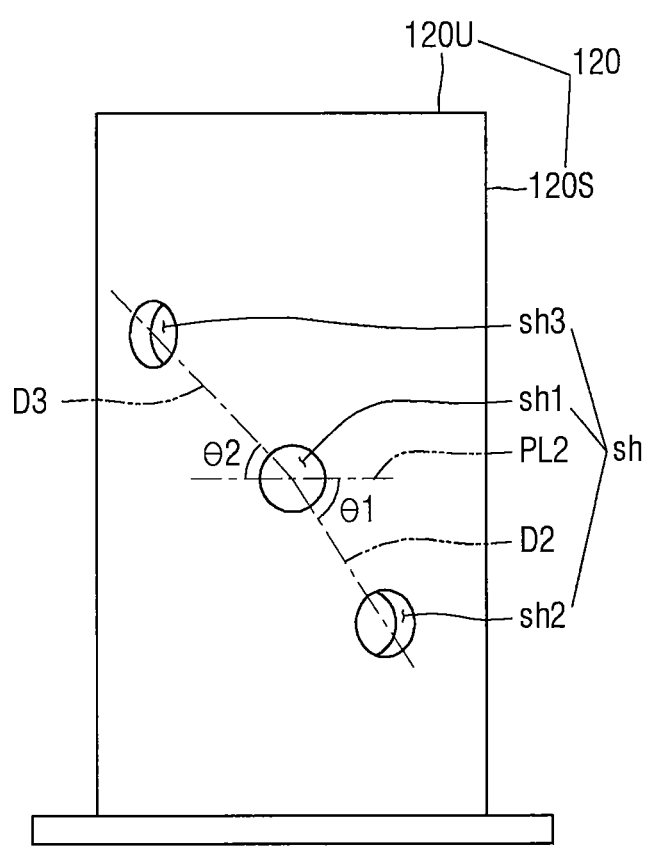
FIG. 4 is a perspective view for illustrating the inner tube and the side wall holes of the film forming apparatus according to some example embodiments of the present disclosure.

FIG. 4 is a view showing the right side surface of the apparatus shown in FIG. 1 for illustrating the inner tube 120 and the side wall holes sh of the film forming apparatus according to some example embodiments of the present disclosure. FIG. 4 shows the inner tube 120 only for the sake of clarity. The inner tube 120 shown in FIG. 4 may be used in place of the inner tube 120 shown in FIG. 1.

Referring to FIG. 4, the first side wall hole sh1 and the second side wall holes sh2 may be aligned in a second direction D2.

The second direction D2 may define or form a first angle θ1 with the upper surface 120U of the inner tube 120. In other words, the second direction D2 may have a first angle θ1 with respect to a second parallel line PL2, for example. The second parallel line PL2 may be parallel to the upper surface 120U of the inner tube 120. For example, the first angle θ1 may be acute, and not perpendicular to the second parallel line PL2. The second parallel line PL2 may be horizontal.

The first side wall hole sh1 and the third side wall hole sh3 may be aligned in a third direction D3. The third direction D3 may define or form a second angle θ2 with the upper surface 120U of the inner tube 120. In other words, the third direction D3 may have a second angle θ2 with respect to the second parallel line PL2, for example. For example, the second angle θ2 may be acute, and not perpendicular to the second parallel line PL2.

The second direction D2 and the third direction D3 may be identical to each other or may intersect with each other.

Hereinafter, a film forming apparatus according to some example embodiments of the present disclosure will be described with reference to FIGS. 5 and 6. For the sake of brevity and clarity, any redundant description may be omitted.

Figure 5:
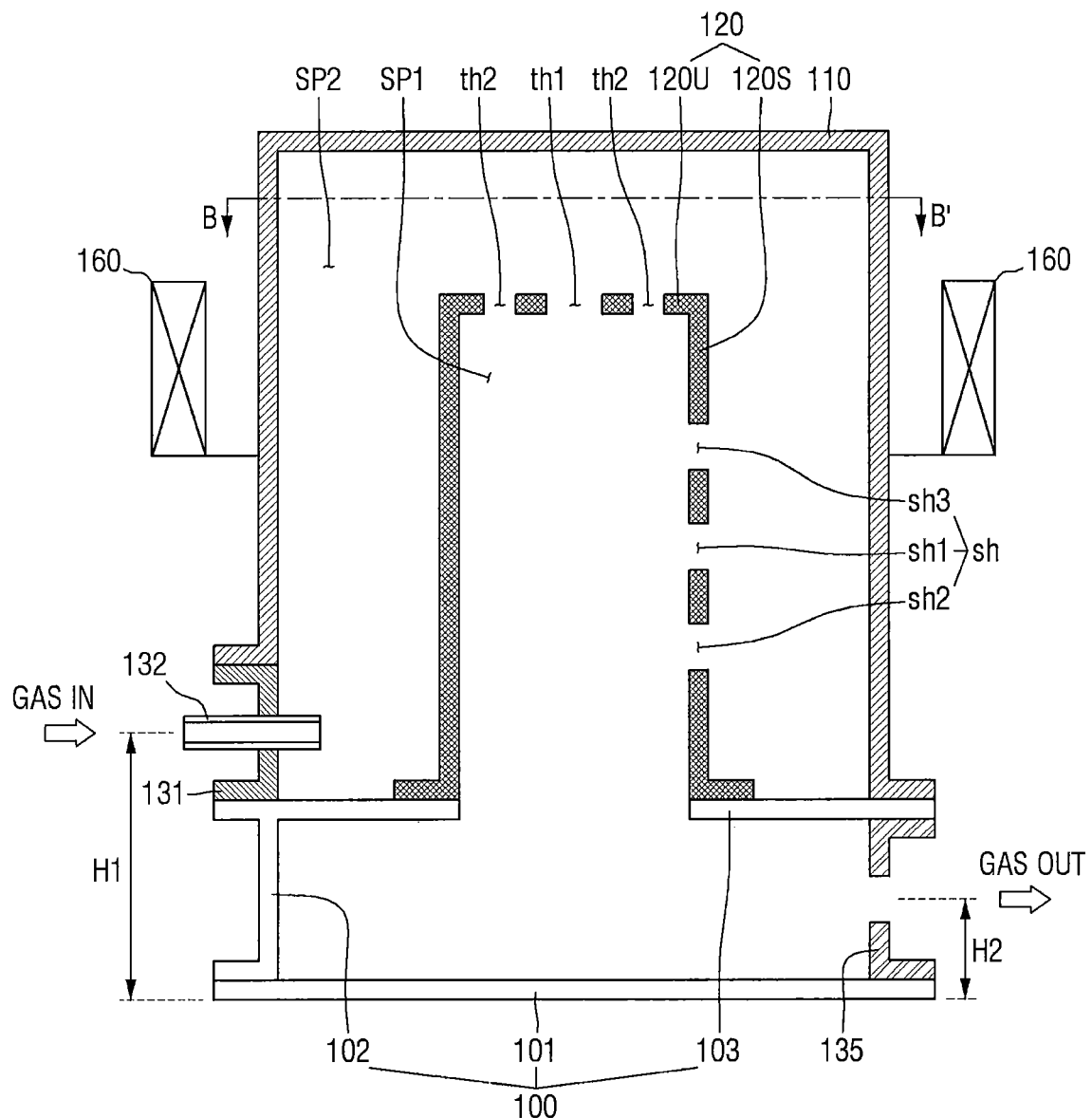
FIG. 5 is a cross-sectional view for illustrating a film forming apparatus according to some example embodiments of the present disclosure.

FIG. 5 is a cross-sectional view for illustrating a film forming apparatus according to some example embodiments of the present disclosure. FIG. 6 is a cross-sectional view taken along line B-B' of FIG. 5. FIG. 6 shows only an outer tube 110 and an inner tube 120 for the sake of clarity.

Figure 6:
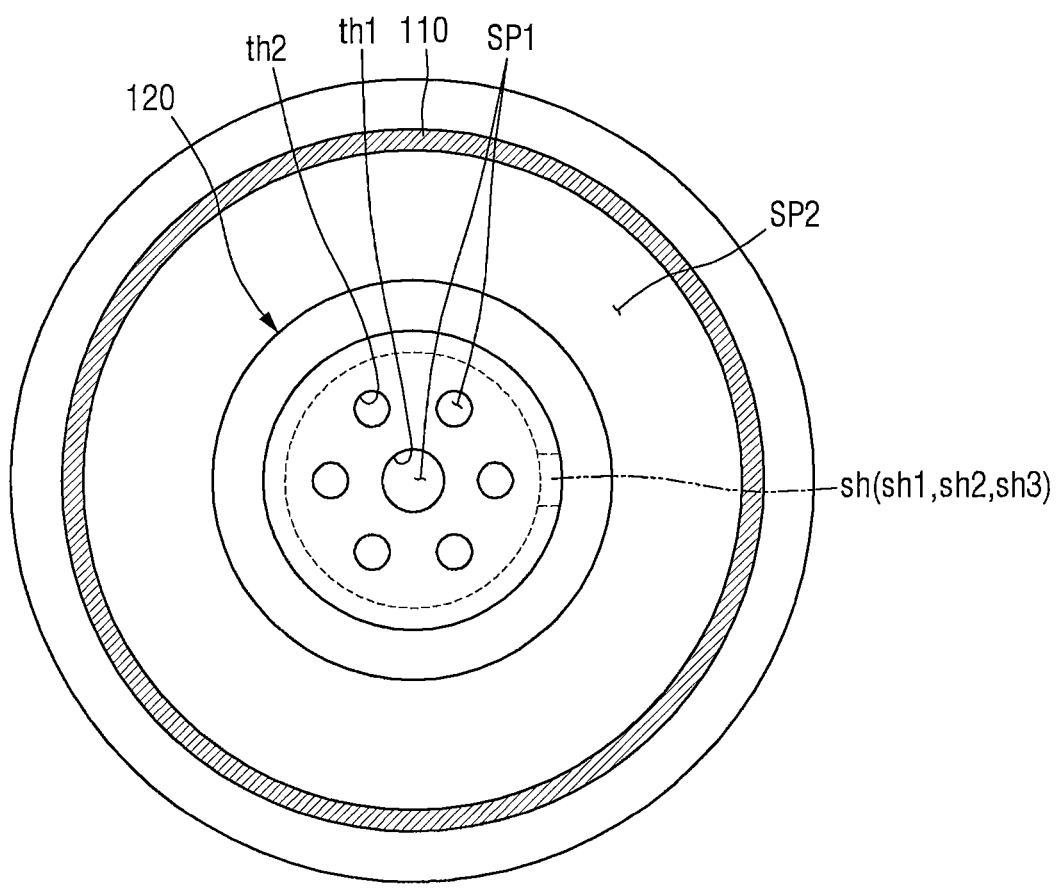
FIG. 6 is a cross-sectional view taken along line B-B' of FIG. 5.

Referring to FIGS. 5 and 6, an upper surface or upper wall 120U of the inner tube 120 may include a first top hole or first upper hole th1 and second top holes or second upper holes th2.

The second top holes th2 may be defined or formed in the upper surface 120U of the inner tube 120 such that they area spaced apart from the first top hole th1. The second top holes th2 may penetrate a part of the upper surface 120U of the inner tube 120. The first top hole th1 and the second top holes th2 may connect (or fluidly connect) the first space SP1 with the second space SP2.

In some example embodiments, more than one second top holes th2 may be provided. The plurality of second top holes th2 may be arranged, for example, around the first top hole th1. The plurality of second top holes th2 may be spaced apart from one another.

Although the first top hole th1 and the second top holes th2 are shown as having different diameters or sizes, the technical idea of the present disclosure is not limited thereto. For example, the first top hole th1 and the second top holes th2 may have the same diameter or size. Alternatively, the diameter or size of the second top holes th2 may be larger than the size of the first top hole th1.

In addition, although the six second top holes th2 are shown in the drawings, the technical idea of the present disclosure is not limited thereto. For example, it is to be understood that the number of the second top holes th2 may vary as required.

In addition, although the second top holes th2 are shown as being arranged around the first top hole th1 in the drawings, the technical idea of the present disclosure is not limited thereto. For example, the first top hole th1 and the second top holes th2 may be arranged in any positions on the upper surface 120U of the inner tube 120 as long as they can connect (or fluidly connect) the first space SP1 with the second space SP2.

Hereinafter, a film forming method according to some example embodiments of the present disclosure will be described with reference to FIGS. 7 to 10. For the sake of brevity and clarity, any redundant description may be omitted.

Figure 7:
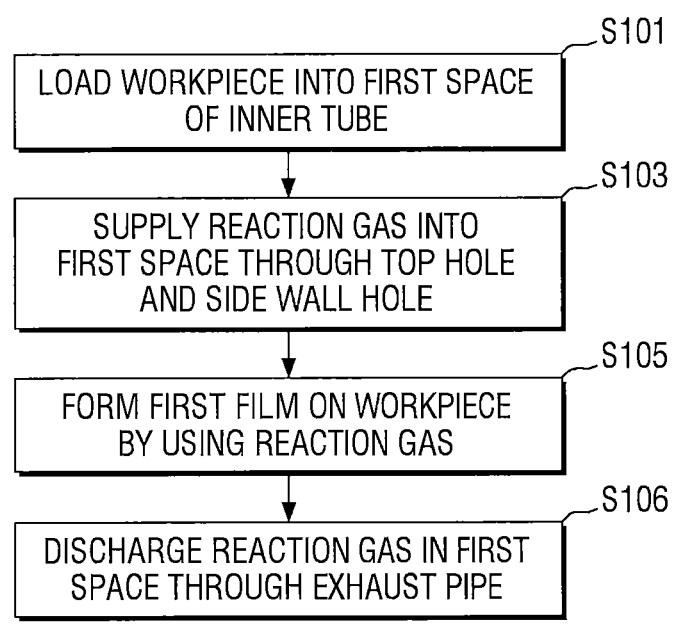
FIG. 7 is a flowchart for illustrating a film forming method according to some example embodiments of the present disclosure.
Figure 8:
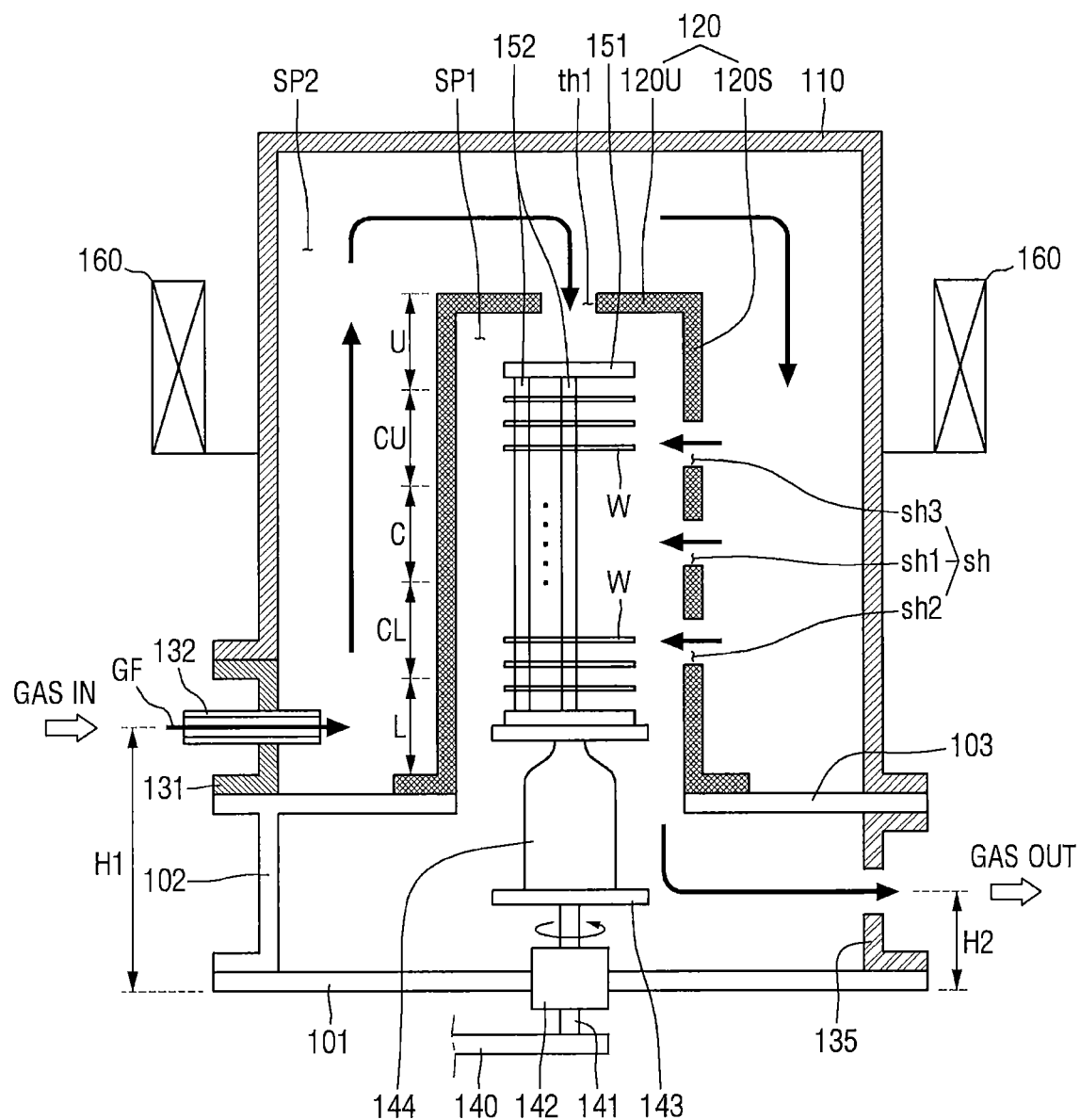
FIGS. 8 and 9 are cross-sectional views for illustrating a film forming method according to some example embodiments of the present disclosure.
Figure 9:
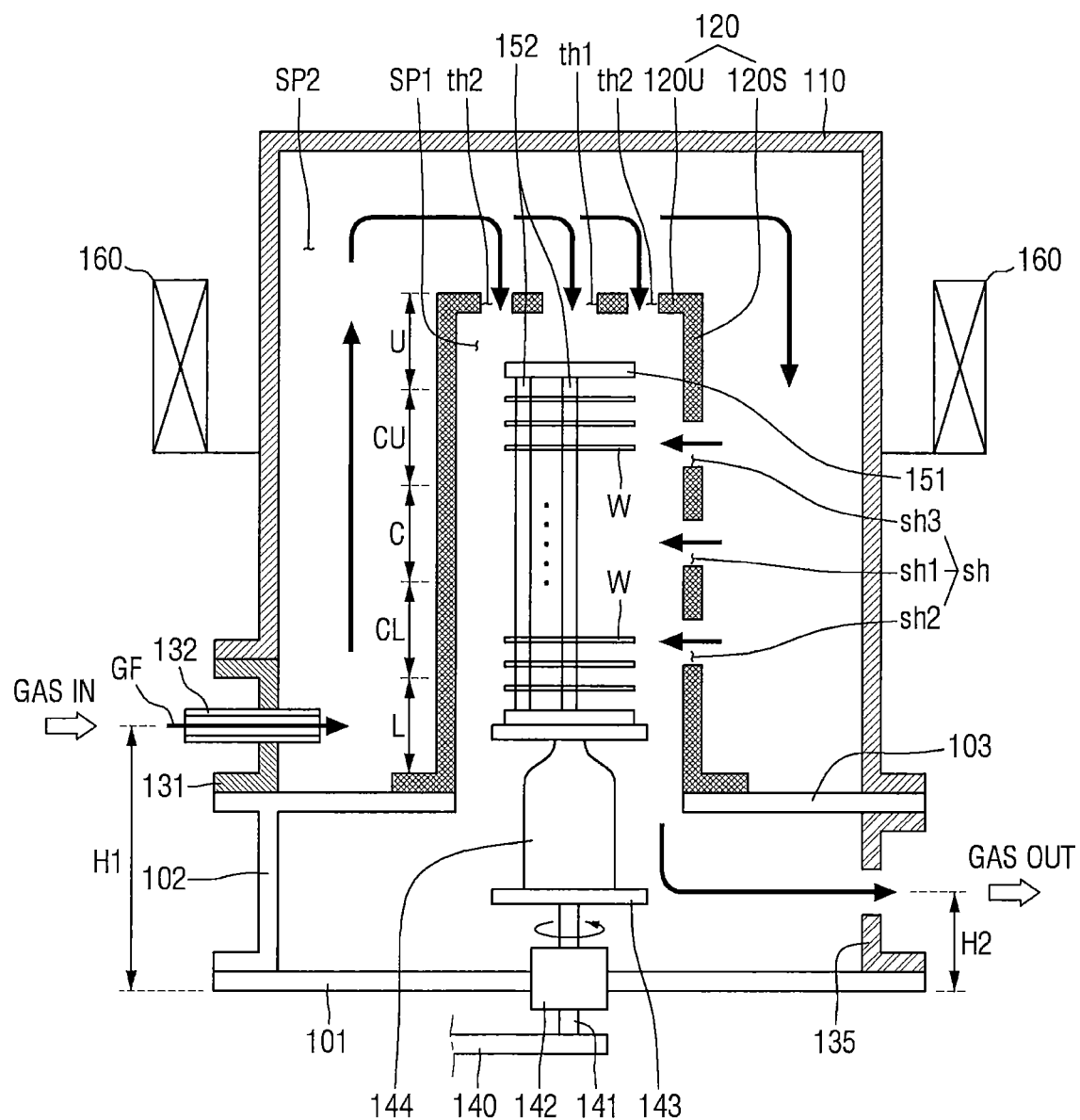
Figure 10:
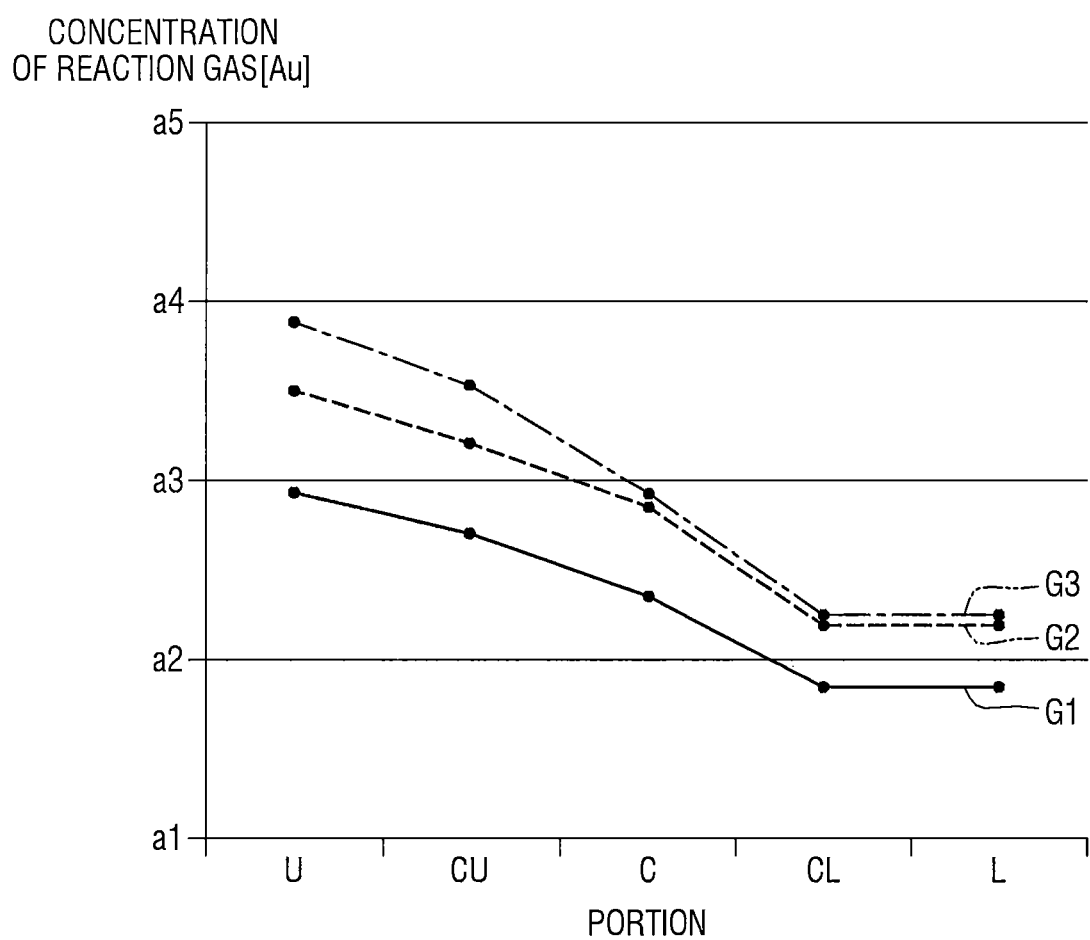
FIG. 10 is a graph for illustrating effects achieved by the film forming method according to some example embodiments of the present disclosure.

FIG. 7 is a flowchart for illustrating a film forming method according to some example embodiments of the present disclosure. FIGS. 8 and 9 are cross-sectional views for illustrating a film forming method according to some example embodiments of the present disclosure. FIG. 10 is a graph for illustrating effects achieved by the film forming method according to some example embodiments of the present disclosure.

In step S101 of FIG. 7, a workpiece may be accommodated in the first space of the inner tube.

Referring to FIGS. 8 and 9, a workpiece W may be accommodated in the first space SP1. The workpiece W may be accommodated in a boat 151 and located in the first space SP1. The workpiece W may be supported by pillars 152 of the boat 151. The workpiece W may be, for example, a semiconductor wafer or a plurality of semiconductor wafers.

The boat 151 may be supported by, for example, boat supports 143 and 144. The boat 151 may be disposed on the boat supports 143 and 144.

The boat supports 143 and 144 may be disposed on a rotary shaft 141 penetrating through the first support 101. The boat supports 143 and 144 may be supported by the rotary shaft 141. For example, a seal member 142 may be disposed on a part of the first support 101 through which the rotary shaft 141 penetrates. The rotary shaft 141 may be rotated while sealing the first space SP1. The rotary shaft 141 may be disposed on an arm 140 connected to a lifting mechanism.

For example, the boat 151 and the first support 101 may be moved up and down by the lifting mechanism and may be inserted into and removed from the inner tube 120.

In step S103 of FIG. 7, the reaction gas may be introduced into the first space through the top holes and the side wall holes.

Referring to FIG. 8, a reaction gas GF may be introduced into the second space SP2 through the nozzle 132 and the reaction gas supply pipe 131. The reaction gas GF introduced into the second space SP2 may flow into the first space SP1 through the first top hole th1, the first side wall hole sh1, the second side wall hole sh2 and the third side wall hole sh3.

When the inner tube 120 further includes the second top hole th2 as shown in FIG. 9, the reaction gas GF flows into the first space SP1 through the first top hole th1, the second top hole th2, the first side wall hole sh1, the second side wall hole sh2, and the third side wall hole sh3.

Since the reaction gas GF is introduced into the first space SP1 through the top hole (the first top hole th1 and/or the second top hole th2), the first side wall hole sh1, the second side wall hole sh2, and the third side wall hole sh3, the reaction gas GF can be supplied into the first space SP1 relatively uniformly.

The reaction gas GF may be used to form a first film on the workpiece W.

In step S105 of FIG. 7, the first film may be formed on the workpiece by using the reaction gas.

Referring to FIGS. 8 and 9, the reaction gas introduced into the first space SP1 through the top hole (the first top hole th1 and/or the second top hole th2) and the side wall holes sh, may form the first film on the workpiece W.

In this example, since a first height H1 is larger than a second height H2, the reaction gas can be supplied into the first space SP1 from the second space SP2 through the top holes (the first top hole th1 and/or the second holes th2), without using a long nozzle.

Since the upper surface 120U of the inner tube 120 is neither entirely closed nor entirely open, the reaction gas GF may have appropriate concentrations at the upper portion U, the central upper portion CU, the central portion C, the central lower portion CL and the lower portion L of the inner tube 120.

For example, referring to FIG. 10, a first curve G1, a second curve G2 and a third curve G3 represent the concentrations of a reaction gas GF in different portions of the inner tube 120 when the reaction gas GF is introduced into the first space SP1.

The x-axis of the graph shown in FIG. 10 may represent an upper portion U, a central upper portion CU, a central portion C, a central lower portion CL and a lower portion L of the inner tube 120. The y-axis of the graph shown in FIG. 10 may represent the concentration of the reaction gas GF in arbitrary unit (Au).

The first curve G1 represents the concentrations of the reaction gas GF at the upper portion U, the central upper portion CU, the central portion C, the central lower portion CL and the lower portion L of the inner tube 120 when the upper surface 120U of the inner tube 120 is entirely open. The second curve G2 represents the concentrations of the reaction gas GF at the upper portion U, the central upper portion CU, the central portion C, the central lower portion CL and the lower portion L of the inner tube 120 when the top holes (the first top hole and/or the second top holes) are formed in the upper surface 120U of the inner tube 120, like the inner tube 120 according to the example embodiments of the present disclosure. The third curve G3 represents the concentrations of the reaction gas GF at the upper portion U, the central upper portion CU, the central portion C, the central lower portion CL and the lower portion L of the inner tube 120 when there is no hole in the upper surface 120U of the inner tube 120.

Comparing the first curve G1 with the second curve G2, the concentration of the reaction gas of the second curve G2 is higher than that of the first curve G1 at the upper portion U of the inner tube 120. In other words, the concentration of the reaction gas at the upper portion U of the inner tube 120 may be higher when there are top holes (the first top hole th1 and/or the second top holes th2) in the inner tube 120 than when the upper surface 120U of the inner tube 120 is entirely open.

In addition, the concentration of the reaction gas of the second curve G2 is higher than that of the first curve G1 at the lower portion L of the inner tube 120. In other words, the concentration of the reaction gas at the lower portion L of the inner tube 120 may be higher when there are top holes (the first top hole th1 and/or the second top holes th2) in the inner tube 120 than when the upper surface 120U of the inner tube 120 is entirely open.

Accordingly, the concentration of the reaction gas at the upper portion U and the lower portion L of the inner tube 120 can be increased when there are the top holes (the first top hole th1 and/or the second top holes th2) in the inner tube 120 compared to when the upper surface 120U of the inner tube 120 is entirely open. In other words, more reaction gas can be introduced into the first space SP1 when there are the top holes (the first top hole th1 and/or the second top holes th2) in the inner tube 120 compared to when the upper surface 120U of the inner tube 120 is entirely open.

Comparing the second curve G2 with the third curve G3, the concentrations of the reaction gas are similar at the central portion C, the central lower than portion CL and the lower portion L of the inner tube 120. However, the concentration of the reaction gas of the third curve G3 is higher than that of the second curve G2 at the upper portion U and the central upper portion CU of the inner tube 120.

For example, the difference between the concentration of the reaction gas at the upper portion U of the inner tube 120 and the concentration of the reaction gas at the central portion C of the third curve G3 is greater than that of the second curve G2.

In other words, when there is no hole in the upper surface or wall 120U of the inner tube 120, the reaction gas introduced into the inner tube 120 may accumulate at the upper portion U of the inner tube 120. On the other hand, by forming the top holes (the first top hole th1 and/or the second top hole th2) in the inner tube 120, it is possible to eliminate the phenomenon that the reaction gas introduced into the first space SP1 accumulates at the upper portion U of the inner tube.

In addition, by forming the top holes (the first top hole th1 and/or the second top holes th2) in the inner tube 120, the concentrations of the reaction gas at the different portions of the inner tube 120 can be uniform compared to when the upper surface 120U of the inner tube 120 is entirely open or when there is no hole in the upper surface 120U of the inner tube 120.

Referring back to FIG. 7, in step S106, the reaction gas in the first space may be discharged through the exhaust pipe.

Referring to FIGS. 8 and 9, the reaction gas GF may be discharged to the outside of the film forming apparatus through the exhaust pipe 135 after the first film is formed on the workpiece W.

Hereinafter, a method of fabricating a semiconductor device according to some example embodiments of the present disclosure will be described with reference to FIG. 11. For the sake of brevity and clarity, any redundant description may be omitted.

Figure 11:
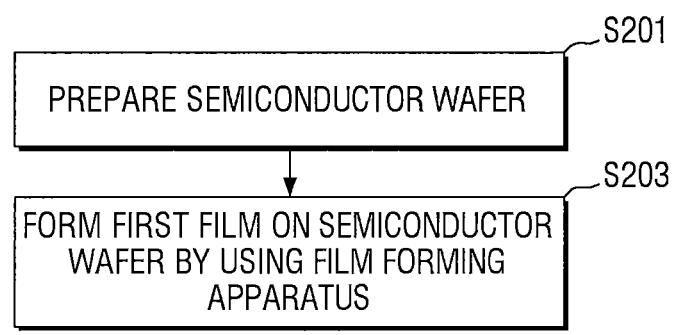
FIG. 11 is a flowchart for illustrating a method of fabricating a semiconductor device according to some example embodiments of the present disclosure.

FIG. 11 is a flowchart for illustrating a method of fabricating a semiconductor device according to some example embodiments of the present disclosure.

In step S201, a semiconductor wafer may be prepared.

A semiconductor wafer (the workpiece W in FIG. 8) may be provided into the first space (the first space SP1 in FIG. 8) of the inner tube of the film forming apparatus.

In step S203, a first film may be formed on the semiconductor wafer using the film forming apparatus according to the example embodiment of the present disclosure.

The method of forming the first film may involve the steps S101, S103, S105 and S106 of FIG. 7.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A film forming apparatus comprising:
an inner tube configured to accommodate a workpiece and having a first space defined by a side wall of the inner tube and an upper wall of the inner tube that is connected to the side wall;
an exhaust pipe fluidly connected to the first space;
at least one top hole defined in the upper wall of the inner tube;
at least one side hole defined in the side wall of the inner tube;
an outer tube surrounding the inner tube; and
a reaction gas supply pipe fluidly connected to a second space defined by and formed between the inner tube and the outer tube,
wherein the reaction gas supply pipe is positioned higher vertically than the exhaust pipe,
wherein the at least one side hole is located only on a first half cylinder of the side wall of the inner tube,
wherein the first half cylinder of the side wall of the inner tube is opposed to a second half cylinder of the side wall of the inner tube that is adjacent and faces the reaction gas supply pipe, and
wherein the apparatus further comprises an inner tube support that vertically separates the at least one side hole from the exhaust pipe such that gas must pass through the first space from the at least one side hole and the at least one top hole prior to exiting the exhaust pipe.

2. The apparatus of claim 1, wherein the at least one top hole comprises a first top hole disposed at a center of the upper wall of the inner tube.

3. The apparatus of claim 2, wherein the at least one top hole further comprises a plurality of second top holes spaced apart from the first top hole and defined in the upper wall of the inner tube and disposed around the first top hole.

4. The apparatus of claim 1, wherein the at least one top hole fluidly connects the first space with the second space.

5. The apparatus of claim 1, further comprising:
a nozzle in the reaction gas supply pipe and facing the second space, wherein the nozzle does not extend along the side wall of the inner tube, and
wherein the nozzle is oriented to introduce reaction gas horizontally into the second space toward the second half cyclinder of the side wall of the inner tube.

6. The apparatus of claim 1, wherein the at least one side hole comprises a first side hole, a second side hole and a third side hole, and
wherein the first side hole is positioned higher vertically than the second side hole, and the third side hole is positioned higher vertically than the first side hole.

7. The apparatus of claim 6, wherein the first, second, and third side holes are aligned in a direction perpendicular to the upper wall of the inner tube.

8. The apparatus of claim 6, wherein the first side hole and the second side hole are aligned in a first direction forming a first angle with the upper wall of the inner tube that is not a right angle, and
wherein the first side hole and the third side hole are aligned in a second direction forming a second angle with the upper wall of the inner tube that is not a right angle.

9. A method of fabricating a semiconductor device, the method comprising:
preparing a semiconductor wafer; and
forming a first film on the semiconductor wafer by using a film forming apparatus,
wherein the film forming apparatus comprises:
an inner tube configured to accommodate the semiconductor wafer and having a first space defined by a side wall of the inner tube and an upper wall of the inner tube connected to the side wall;
an exhaust pipe fluidly connected to the first space;
at least one top hole defined in the upper wall of the inner tube;
at least one side hole defined in the side wall of the inner tube;
an outer tube surrounding the inner tube; and
a reaction gas supply pipe fluidly connected to a second space defined by and formed between the inner tube and the outer tube,
wherein the reaction gas supply pipe is positioned higher vertically than the exhaust pipe,
wherein the at least one side hole is located only on a first half cylinder of the side wall of the inner tube,
wherein the first half cylinder of the side wall of the inner tube is opposed to a second half cylinder of the side wall of the inner tube that is adjacent and faces the reaction gas supply pipe, and
wherein the apparatus further comprises an inner tube support that vertically separates the at least one side hole from the exhaust pipe such that gas must pass through the first space from the at least one side hole and the at least one top hole prior to exiting the exhaust pipe.

10. The method of claim 9, wherein the forming the first film on the semiconductor wafer using the film forming apparatus comprises:
placing the semiconductor wafer in the first space;
supplying a reaction gas used to form the first film into the second space through the reaction gas supply pipe,
wherein the reaction gas is introduced into the first space through the at least one top hole and the at least one side hole;
forming the first film on the semiconductor wafer using the reaction gas; and
discharging the reaction gas in the first space through the exhaust pipe.

11. The method of claim 9, wherein the at least one top hole comprises a first top hole disposed at a center of the upper wall of the inner tube.

12. The method of claim 11, wherein the at least one top hole further comprises a plurality of second top holes spaced apart from the first top hole and defined in the upper wall of the inner tube and disposed around the first top hole.

13. The method of claim 9, wherein the film forming apparatus further comprises:
a nozzle in the reaction gas supply pipe and facing the second space,
wherein the nozzle does not extend along the side wall of the inner tube.

14. A film forming apparatus comprising:
an inner tube configured to accommodate a workpiece and having a first space defined by a side wall of the inner tube and an upper wall of the inner tube that is connected to the side wall;
an exhaust pipe fluidly connected to the first space;
at least one top hole defined in the upper wall of the inner tube;
at least one side hole defined in the side wall of the inner tube;
an outer tube surrounding the inner tube;
a reaction gas supply pipe fluidly connected to a second space defined by and formed between the inner tube and the outer tube; and
a nozzle in the reaction gas supply pipe and facing the second space, wherein the nozzle does not extend along the side wall of the inner tube,
wherein the nozzle is oriented to introduce reaction gas horizontally into the second space toward the side wall of the inner tube,
wherein the at least one side hole is located only on a first half cylinder of the side wall of the inner tube,
wherein the first half cylinder of the side wall of the inner tube is opposed to a second half cylinder of the side wall of the inner tube that is adjacent and faces the reaction gas supply pipe, and
wherein the apparatus further comprises an inner tube support that vertically separates the at least one side hole from the exhaust pipe such that gas must pass through the first space from the at least one side hole and the at least one top hole prior to exiting the exhaust pipe.

15. The apparatus of claim 14, wherein the at least one top hole comprises a first top hole disposed at a center of the upper wall of the inner tube.

16. The apparatus of claim 15, wherein the at least one top hole further comprises a plurality of second top holes spaced apart from the first top hole and defined in the upper wall of the inner tube and disposed around the first top hole.

17. The apparatus of claim 14, wherein the at least one top hole fluidly connects the first space with the second space.

18. The apparatus of claim 14, wherein the at least one side hole comprises a first side hole, a second side hole and a third side hole,
wherein the first side hole is positioned higher vertically than the second side hole, and the third side hole is positioned higher vertically than the first side hole,
wherein the first side hole and the second side hole are aligned in a first direction forming a first angle with horizontal that is not a right angle, and wherein the first side hole and the third side hole are aligned in a second direction forming a second angle with horizontal that is not a right angle.

19. The apparatus of claim 14, wherein the reaction gas supply pipe is positioned higher vertically than the exhaust pipe.

* * * * *